United States Patent
Askari et al.

(10) Patent No.: US 12,300,964 B2
(45) Date of Patent: May 13, 2025

(54) WAFER-LEVEL ETCHED FACET FOR PERPENDICULAR COUPLING OF LIGHT FROM A SEMICONDUCTOR LASER DEVICE

(71) Applicant: Skorpios Technologies, Inc., Albuquerque, NM (US)

(72) Inventors: Murtaza Askari, Albuquerque, NM (US); Stephen B. Krasulick, Albuquerque, NM (US); Majid Sodagar, Albuquerque, NM (US); John Zyskind, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 18/405,337

(22) Filed: Jan. 5, 2024

(65) Prior Publication Data
US 2024/0275123 A1 Aug. 15, 2024

Related U.S. Application Data

(60) Division of application No. 17/541,933, filed on Dec. 3, 2021, now Pat. No. 11,901,692, which is a continuation-in-part of application No. 16/698,853, filed on Nov. 27, 2019, now Pat. No. 11,217,963.

(60) Provisional application No. 62/771,979, filed on Nov. 27, 2018.

(51) Int. Cl.
| | |
|---|---|
| *H01S 5/022* | (2021.01) |
| *G02B 6/13* | (2006.01) |
| *H01S 5/02* | (2006.01) |
| *H01S 5/028* | (2006.01) |

(52) U.S. Cl.
CPC .............. *H01S 5/022* (2013.01); *G02B 6/13* (2013.01); *H01S 5/0202* (2013.01); *H01S 5/028* (2013.01)

(58) Field of Classification Search
None
See application file for complete search history.

(56) References Cited

U.S. PATENT DOCUMENTS

| | | | |
|---|---|---|---|
| 5,989,932 | A | 11/1999 | Freund et al. |
| 6,214,178 | B1 * | 4/2001 | Chakrabarti ............ H01S 5/028 216/66 |
| 8,634,442 | B1 | 1/2014 | Raring et al. |
| 9,316,785 | B2 | 4/2016 | Krasulick et al. |
| 11,217,963 | B1 | 1/2022 | Askari et al. |
| 11,901,692 | B2 | 2/2024 | Askari et al. |
| 2003/0029836 | A1 | 2/2003 | Lindstrom et al. |
| 2003/0169981 | A1 | 9/2003 | Nakanishi et al. |

(Continued)

OTHER PUBLICATIONS

U.S. Appl. No. 16/698,853, First Action Interview Pilot Program Pre-Interview Communication, Mailed On Mar. 31, 2021, 4 pages.

(Continued)

*Primary Examiner* — Jerry Rahll
(74) *Attorney, Agent, or Firm* — Kilpatrick Townsend & Stockton LLP

(57) ABSTRACT

A semiconductor laser device is provided. The semiconductor laser device includes: a substrate having a first facet; a guiding layer having a second facet through which an output light is configured to be emitted; a bottom dielectric layer between the substrate and the guiding layer; and a top dielectric layer on the guiding layer. The second facet is at an angle relative to the first facet.

20 Claims, 12 Drawing Sheets

(56) References Cited

U.S. PATENT DOCUMENTS

| | | |
|---|---|---|
| 2006/0187985 A1 | 8/2006 | Behfar |
| 2012/0177075 A1 | 7/2012 | Koeth |
| 2014/0153600 A1* | 6/2014 | Luo ....................... B82Y 20/00 372/40 |
| 2014/0219305 A1* | 8/2014 | Fang ........................ H01S 5/16 372/45.01 |
| 2015/0098676 A1* | 4/2015 | Krasulick .......... G02B 6/12004 438/27 |
| 2015/0244147 A1* | 8/2015 | Stojetz ................... H01S 5/028 372/49.01 |
| 2018/0083417 A1 | 3/2018 | Pezeshki et al. |

OTHER PUBLICATIONS

U.S. Appl. No. 16/698,853, Notice of Allowance, Mailed On Aug. 6, 2021, 12 pages.

U.S. Appl. No. 17/541,933, Notice of Allowance, Mailed On Oct. 3, 2023, 9 pages.

\* cited by examiner

WAFER-LEVEL ETCHED FACET FOR PERPENDICULAR COUPLING OF LIGHT FROM A SEMICONDUCTOR LASER DEVICE

CROSS-REFERENCE TO RELATED APPLICATIONS

This application is a divisional application of U.S. application Ser. No. 17/541,933 by Askari et al., entitled "WAFER-LEVEL ETCHED FACET FOR PERPENDICULAR COUPLING OF LIGHT FROM A SEMICONDUCTOR LASER DEVICE," filed on Dec. 3, 2021, which is a continuation-in-part application of U.S. application Ser. No. 16/698,853 by Askari et al., entitled "WAFER LEVEL COATINGS FOR PHOTONIC DIE," filed on Nov. 27, 2019, now issued U.S. Pat. No. 11,217,963, which application claims priority to U.S. Provisional Application No. 62/771,979 by Askari et al., entitled "WAFER LEVEL COATINGS FOR PHOTONIC DIE," filed on Nov. 27, 2018, the disclosures of which are hereby incorporated by reference in their entirety for all purposes.

U.S. application Ser. No. 14/509,914 by Krasulick et al., entitled "INTEGRATION OF AN UNPROCESSED, DIRECT-BANDGAP CHIP INTO A SILICON PHOTONIC DEVICE," filed on Oct. 8, 2014, now issued U.S. Pat. No. 9,316,785, is incorporated by reference in its entirety for all purposes.

BACKGROUND

A semiconductor laser typically surrounds a gain medium, such as a direct bandgap, compound semiconductor material, with at least partially reflective mirrors to create a resonant cavity. As the gain medium emits light, the light is constrained by the resonant cavity to be coherent, that is, in-phase and within a specific, very narrow spectral range. One mirror of the cavity (sometimes called the "back mirror") is usually highly reflective; such mirrors may be formed, for example, of metal reflectors or other highly reflective coatings. Another mirror of the cavity (sometimes called the "front mirror" or "output mirror") is partially transmissive to let some of the emitted light escape the cavity as output light. Partially transmissive mirrors called distributed Bragg reflectors (DBRs) can be made by creating regions of materials having different refractive indices, transverse to a light path. Each change in refractive index generates a Fresnel reflection related to the difference between refractive indices. Although each Fresnel reflection is typically only a very small percentage of the incident light, providing enough of these partially reflective material interfaces can generate a highly reflective layer stack. Also, within each region of each material an opportunity exists for constructive or destructive interference between light propagating in forward and reverse directions along the light path, so length of each material along the light path is important. Thus, net reflection and transmission in the light path can be adjusted by providing material changes in the light path with a known number and magnitude of refractive index changes, and length of each material in the light path. Mirrors made in this manner can be optimized for either front or back mirror use.

A semiconductor laser may be formed and used as a stand-alone component, and may be considered a photonic die on its own. Alternatively, a semiconductor laser may be used and formed as part of a more complex photonic die, as a useful and controllable light source for applications including, but not limited to, high speed data transfer, telecommunications, and optical instrumentation. In the more complex photonic die, light generated by one or more lasers may be guided (e.g., with waveguides) into other optical and/or electronic components where the light may be modified. As-emitted light, or optionally modified light, is generally transmitted out of a photonic die at some point, and into media such as air, fiber optics or other optical devices.

Lasers can be very sensitive to any outside reflection of light going back into the resonant cavity. The location where output light exits a photonic die can generate reflections that can propagate backwards into the laser, presenting a hazard to the laser. Reflections that re-enter the laser's resonant cavity can result in undesirable effects such as amplitude noise, linewidth broadening, or multi-cavity-mode lasing. Because of these effects, photonic die (including stand-alone semiconductor lasers) may be provided with an antireflection coating where light leaves the photonic die, to help defeat output reflections.

SUMMARY

Systems and methods herein recognize the advantages of improved methods and materials for addition to edges of photonic die, including edge-emitting semiconductor lasers. The materials described herein may be used as portions of reflective coatings including highly reflective coatings, anti-reflective coatings, and/or for other purposes. The, methods, techniques and materials described herein are made desirably easily, repeatably, and inexpensively. In addition, by decoupling the dicing angle from the laser facet angle of a semiconductor laser device, it is possible to choose a relatively large incident angle and still have the refractive light coming out substantially perpendicular to the substrate facet, making it easier for subsequent packaging and coupling to optical fibers or lenses.

In one or more embodiments, a semiconductor laser device is provided. The semiconductor laser device includes: a substrate having a first facet; a guiding layer having a second facet through which an output light is configured to be emitted; a bottom dielectric layer between the substrate and the guiding layer; and a top dielectric layer on the guiding layer. The second facet is at an angle relative to the first facet (e.g., the angle is less than 30, 40, 45, 60, 75, or 90 degrees, such that the first facet and the second facet are on a same side of the semiconductor laser device).

In one or more embodiments, a method for fabrication a semiconductor device is provided. The method includes the following steps: receiving a semiconductor structure comprising a guiding layer and a substrate; etching the guiding layer to form a first facet through which an output light is configured to be emitted; depositing a coating on the first facet; and singulating the substrate to form a second facet, after depositing the coating on the first facet, wherein the first facet is at an angle relative to the second facet of the substrate.

In one or more embodiments, a semiconductor laser device is provided. The semiconductor laser device includes: a platform comprising: a substrate having a first facet; a guiding layer having a waveguide and a second facet through which an output light is configured to be emitted from the waveguide, wherein the second facet is at an angle relative to the first facet; a bottom dielectric layer between the substrate and the guiding layer; a top dielectric layer on the guiding layer; and walls forming a recess in the platform; and a gain chip bonded to the platform in the recess, the gain chip comprising a third facet, wherein: the gain chip is optically end coupled with the guiding layer of the platform;

and the third facet is angled with respect to a propagation direction of the waveguide in the guiding layer.

Further areas of applicability of the present disclosure will become apparent from the detailed description provided hereinafter. It should be understood that the detailed description and specific examples, while indicating various embodiments, are intended for purposes of illustration only and are not intended to limit the scope of the disclosure.

BRIEF DESCRIPTION OF THE DRAWINGS

Embodiments are described in detail below with reference to the following figures, in which like numerals within the drawings and mentioned herein represent substantially identical structural elements.

DETAILED DESCRIPTION

Figure 1A:
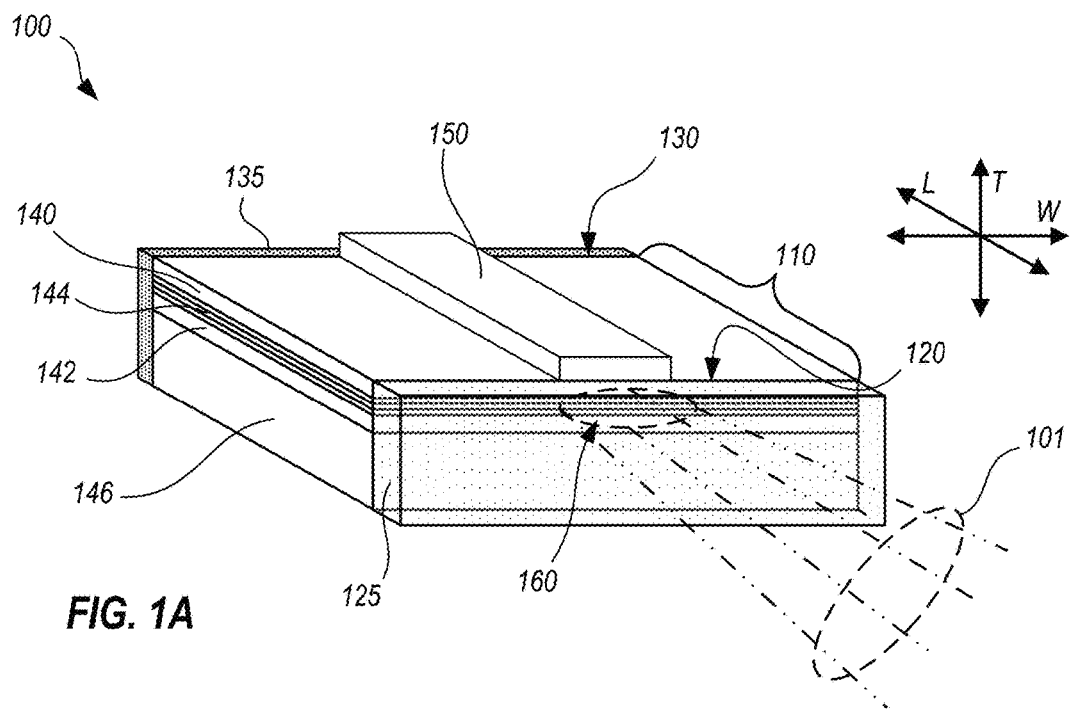
FIG. 1A schematically illustrates a semiconductor laser that forms a resonant cavity between a front mirror on a front facet, and a back mirror on a back facet, according to one or more embodiments.

The subject matter of certain embodiments are described here with specificity to meet statutory requirements, but this description is not intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described. Each example is provided by way of illustration and/or explanation, and not as a limitation. For instance, features illustrated or described as part of one embodiment may be used on another embodiment to yield a further embodiment. Upon reading and comprehending the present disclosure, one of ordinary skill in the art will readily conceive many equivalents, extensions, and alternatives to the specific, disclosed apparatus and structures, all of which are within the scope of embodiments herein.

One form of DBR arranges refractive index changes by applying successive material layers that are transverse to the light path. The material layers can be applied by various means such as applying alternating layers of materials (e.g., when the expected light propagation direction is transverse to the layers) or by etching properly spaced recesses in a layer of a first material, and depositing a second material into the recesses (e.g., when the expected light propagation direction is transverse to the recesses). For example, vertical cavity surface-emitting lasers (VCSELs) typically use this approach by growing alternating layers of materials using metalorganic chemical vapor deposition (MOCVD) or molecular beam epitaxy (MBE).

The reflection spectrum of such multi-layer stack DBRs can be very sensitive to small changes in refractive index and/or coating thicknesses within the stack. This sensitivity creates challenges for "edge-emitting" lasers that are formed using die-edge multi-layer mirrors. Because of the need for tight thickness control, an edge of an edge-emitter semiconductor die where the mirror is being formed may be first carefully singulated out of a piece of semiconductor, then formed and/or polished to produce a very flat surface. Thus, subsequently formed regions adjacent to the polished surface will be planar and squarely transverse to the intended light path within the die. Then, the edge-emitter die is placed within a fixture that presents the edge face as a horizontal surface to processing equipment.

As noted below, sputtering or evaporation equipment is typically used to provide DBR coatings, and since sputtering and evaporation tend to provide "line of sight" depositions (e.g., sputtered or evaporated materials tend to travel in a straight line and stick to the first surface that they encounter) the orientation of the edge face to the material source is important.

Certain embodiments herein are based on an appreciation that highly reflective and/or antireflective coatings for photonic die, including semiconductor lasers and/or photodetectors, may be provided by materials that are not typically used in semiconductor manufacturing, such as $TiO_2$, $Ta_2O_5$, and/or $Al_2O_3$. These materials can be deposited by evaporation or sputtering. However, processing equipment that for these depositions is somewhat specialized and may not be found in fabrication areas ("fabs") that primarily handle silicon-based manufacturing.

Certain embodiments are based on an appreciation of a novel way to deposit coatings on edges of photonic die. In particular, although deposition and metrology are usually optimized for horizontal surfaces, as discussed elsewhere herein, techniques have been developed for performing and controlling deposition thicknesses on vertical surfaces.

In a first example, FIG. 1A schematically illustrates an edge-emitting semiconductor laser 100 that forms a resonant cavity 110 between a front mirror 125 on a front facet 120, and a back mirror 135 on a back facet 130. Semiconductor laser 100 shown is typically fabricated by depositing and/or growing cladding layers 140 and 142, quantum wells 144 and others, as shown in FIG. 1A, on a compound semiconductor substrate 146. A ridge waveguide may be formed from the same material as top cladding 140 and/or additional material(s) deposited thereon, to guide light into a desired propagation direction within laser 100. Ridge waveguide 150 may also provide electrical connectivity to one side of a p-n diode formed by laser 100, and substrate 146 may supply electrical connectivity to the other side of the p-n diode. Then, substrate 146 would be singulated into individual chips. Typically, front and back facets 120 and 130 would be polished and processed to provide front and back mirrors needed. However, in some embodiments described below, emission through back facet 130 is not needed, so back mirror 135 can be formed either from metal or by a highly reflective multi-layer structure (e.g., enough refractive index changes of sufficient magnitude to make the back mirror 95%-99.99% reflective). Since emission is desired from front facet 120, an opaque metal mirror is not suitable as front mirror 125. In this example front mirror 125 may be formed by a partially reflective DBR structure (e.g., perhaps 90%-95% reflective) so that some light 101 is emitted as output light from an emission area 160. Providing the partially reflective DBR structure is an application for high reflectivity coatings, as described below.

It is helpful to note that in connection with devices grown, etched or otherwise fabricated on a substrate herein, terms such as "top," "bottom," "above," "below," "vertical," "horizontal" and the like are sometimes used to aid in understanding features shown in the drawings and the appended claims. To provide an appropriate frame of reference for these terms, FIG. 1A and other drawings herein include axes labeled L, T and/or W. Direction T (thickness) is considered a "vertical" direction, while directions L (length) and W (width) are both considered "horizontal" directions. These meanings are adhered to, notwithstanding that, for example, elements described below could be turned in various directions during fabrication and/or subsequent use. It can be seen that, generally speaking, a substrate (e.g., a wafer, or a singulated portion of a wafer) on which a device is fabricated will have a length and a width that are substantially greater than a thickness of the device and especially individual features thereof.

Figure 1B:
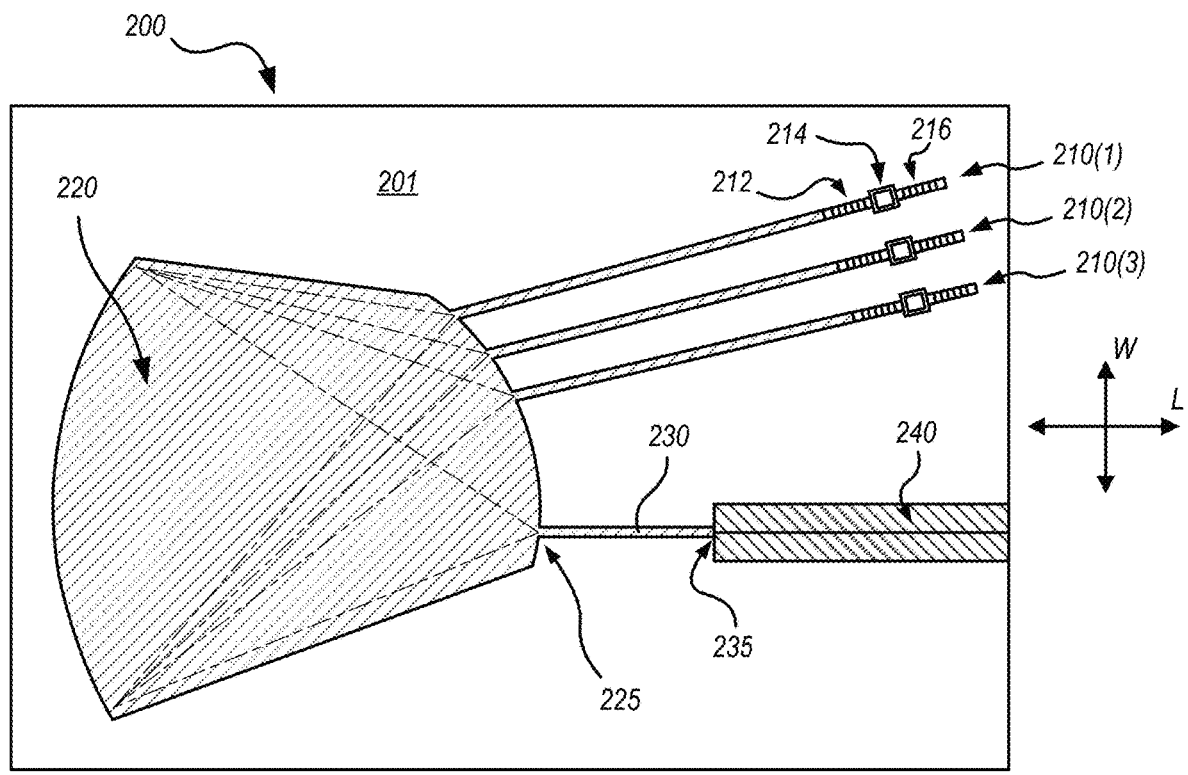
FIG. 1B is a schematic plan view of a photonic die that combines output of several input lasers with an echelle grating into a waveguide, according to one or more embodiments.

In a second example, FIG. 1B schematically illustrates, in a plan view, a photonic die 200 that combines output of several input lasers 210(1) 210(2), 210(3), with an echelle grating 220, into a waveguide 230. Because FIG. 1B is a plan view, axis T is not shown (the T direction is in and out of the plane of FIG. 1B). Input lasers 210(1) 210(2), 210(3), echelle grating 220 and waveguide 230 may be integrated with, and/or fabricated from one or more parts of, a silicon-based platform 201 which may be, for example, a silicon or silicon-on-insulator substrate. While not required, use of a silicon-based platform 201 may be advantageous due to, for example, much lower cost than compound semiconductor substrates, and the existence of many wafer fabrication tools and techniques common to silicon-based (e.g., CMOS) semiconductor manufacturing. Input lasers 210(1) 210(2) and 210(3) each include a respective gain chip 214 in optical communication with DBRs 212 and 216, as illustrated. Each pair of DBRs 212 and 216 form an optical cavity about gain chip 214 (only one set of such devices is labeled, for clarity of illustration). Each of lasers 210(1) 210(2) and 210(3) provides output at a slightly different wavelength. Echelle grating 220 forms a single output port 225 that passes output light into a waveguide 230, which ends at an output facet 235. Photonic die 200 forms a V-groove 240 adjacent to output facet 235, so that an optical fiber (not shown) can align to the output facet and take the output light to other components or an instrument output. Echelle grating 220 is capable of diffracting light of different wavelengths through different angles, so although input lasers 210(1) 210(2) and 210(3) are of different wavelengths, their output can be combined into output port 225 and output waveguide 230. However, if output facet 235 generates reflections, portions of the output light could reflect back through output waveguide 230 and echelle grating 220, and be diffracted back to their originating lasers 210(1) 210(2), 210(3).

Providing an antireflective coating for the output facet 235 is thus desirable, and an application for antireflective coatings, as described below. This is but one instance showing that in general, it is desirable to provide antireflective coatings on transmitting devices of various types, to protect source lasers from reflections. It is also desirable to provide antireflective coatings for photodetectors, for example the detectors that receive incoming light in an optical communication system and generate an electronic signal from the light. The antireflective coating enhances performance by increasing the net light delivered to the detector, thus increasing the strength of the electronic signal generated.

It can be seen that the semiconductor laser in FIG. 1A and the photonic die in FIG. 1B are both essentially edge-emitting devices. That is, the edges on which reflective and/or antireflective performance is needed, are generally formed as vertical edges with respect to a horizontal substrate surface (e.g., a wafer on which the structures shown are provided by typical semiconductor type processing). A significant reason that typical wafer fabrication techniques and materials may not be used for highly reflective and/or antireflective coatings on edge-emitting devices, is that coating thicknesses on vertical facets are not readily determined by normal fabrication metrology. For example, a wide variety of tools use ellipsometry and/or reflectometry to measure coating thicknesses on horizontal wafer surfaces that are easy to access optically. A test wafer on which a coating is deposited can generally be placed upon a wafer stage, act as a mirror, and span a large area (e.g., millimeters) for access by the metrology tool. However, such tools are not configured to measure coating thicknesses on vertical edges that may be on the order of only microns deep and are immediately adjacent to other features generating reflections. Additionally, the planar nature of semiconductor devices has typically favored the development of deposition tools that deposit very uniform coatings on horizontal wafer surfaces, but such coatings may or may not be of the same thickness as the coating deposited at the same time, on a vertical surface. Thus, in practice, the devices illustrated in FIGS. 1A and 1B are typically fabricated in wafer form except for the vertical edge coatings, then singulated and turned edgewise, that is, with the vertical edges turned upwards to form horizontal surfaces, to add the coatings.

A. Coating

Figure 2:
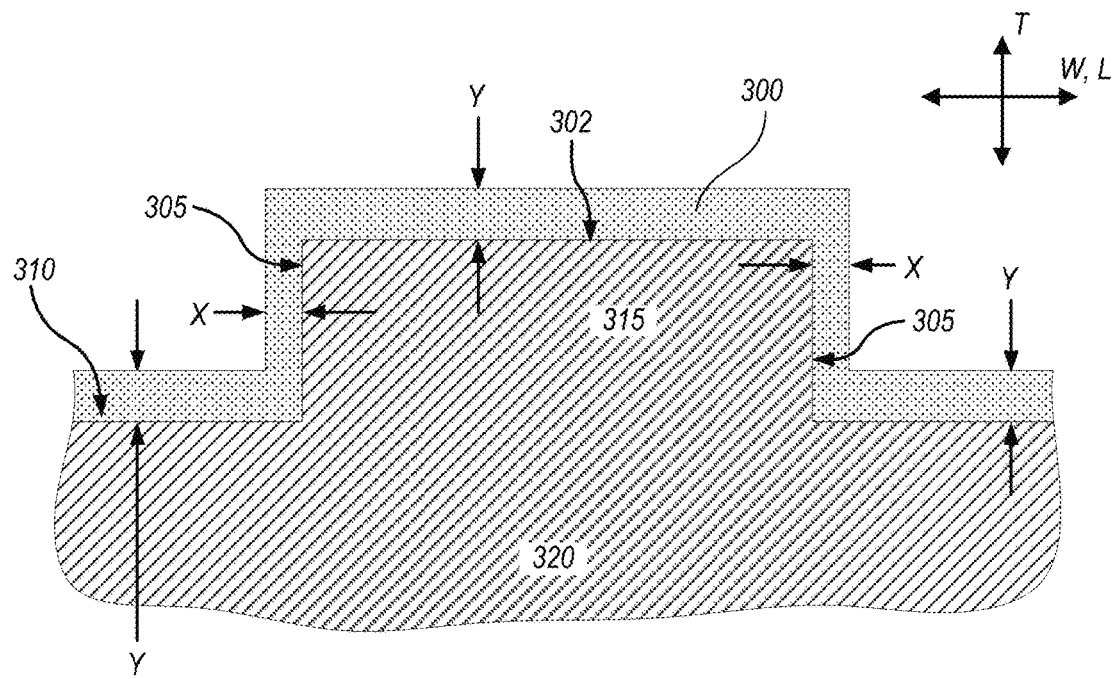
FIG. 2 schematically illustrates a material deposited on a feature that extends vertically from a wafer surface, according to one or more embodiments.

FIG. 2 schematically illustrates, in a partial cross-sectional view, a coating 300 deposited on a feature 315 that extends vertically from a surface 310 of a substrate 320, to an upper surface 302, thus forming vertical edges 305. In FIG. 2, the T direction is vertical, and the horizontal direction could be considered either of directions W or L. It should be appreciated from the discussion of FIGS. 1A and 1B that material thicknesses on an as-fabricated, vertical light-emitting edge will determine the reflective and/or antireflective effects they provide if the feature shown is an edge-emitting optical device.

As discussed above, when coatings are deposited to a given thickness on a horizontal surface (e.g., thickness Y above surfaces 302 or 310 in FIG. 2), a corresponding thickness along an adjacent vertical surface (e.g., thickness X adjacent to vertical edge 305) can vary from Y. Not only can X vary from Y, but the feature and coating geometries illustrated in FIG. 2 correspond to an idealized case wherein the coating thickness on the vertical edge is constant, and does not vary, but this is not always the case. Typical factors that influence X include but are not limited to the type of coating 300 being deposited, the deposition technique, distance of the location where X is measured from the upper and lower corners of the feature 315, slope of the feature 315 relative to the substrate where X is measured, proximity of the vertical feature 315 to other such features, the type of substrate 320, and/or whether substrate 320 is in direct contact with the processing equipment, or in a carrier type arrangement (e.g., see FIGS. 4 and 5 below), in addition to the factors that influence Y.

FIG. 2 can be considered to illustrate an example of an optical component of a photonic die, where the optical component is capable of emitting and/or receiving light. The component has a length and width (dimensions W, L) that are substantially greater than a thickness thereof (dimension T). The thickness (dimension T) defines a vertical direction, in terms of providing a frame of reference for "vertical" herein.

Figure 3:
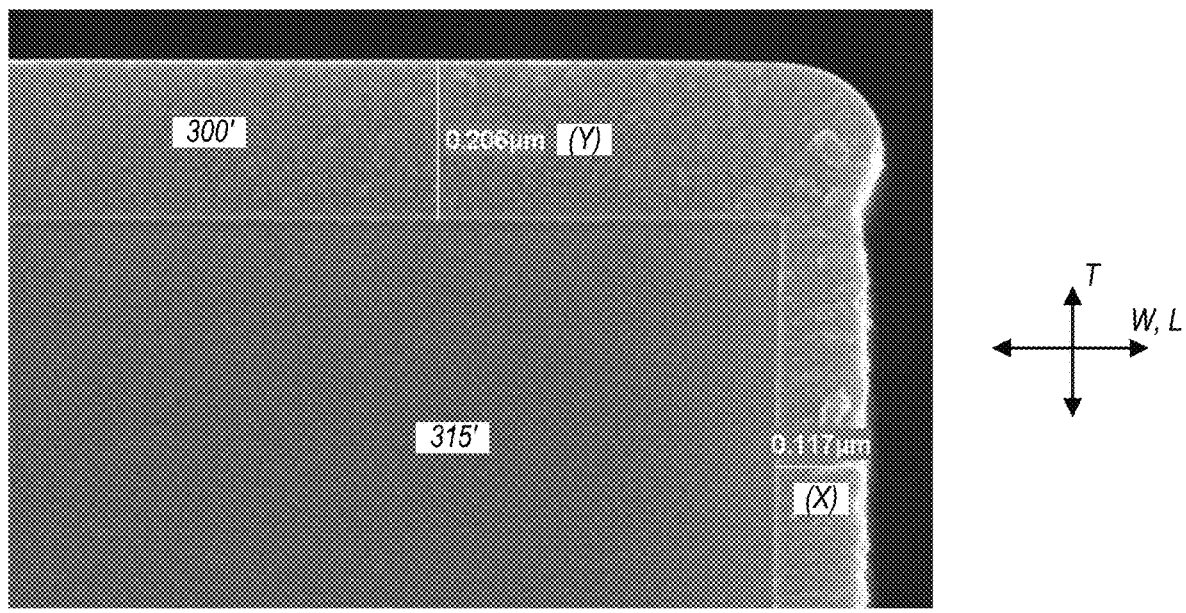
FIG. 3 is a scanning electron microscope (SEM) photograph of a feature with a film deposited thereon, according to one or more embodiments.

FIG. 3 is a scanning electron microscope (SEM) photograph that provides a partial cross-sectional view of a feature 315' with a coating 300' deposited thereon, that illustrates some of the factors noted above. Again, in FIG. 3, the T direction is vertical, and the horizontal direction could be considered either of directions W or L. An upper corner of a feature etched with a vertical sidewall, then coated with a coating, is shown. The coating can be seen to be uniform over the flat top surface of the feature, with a coating thickness Y of 0.206 µm measured at one location. However, the thickness X along the vertical edge is less uniform, and has a "breadloaf" shape where X first decreases, then increases as coating 300' approaches the upper corner of the feature. At one location, the coating thickness X along the vertical edge is measured at 0.117 µm.

Despite the challenges noted above, the present inventors have found that in most circumstances, and subject to constraints such as measuring at a particular level, a relationship of X to Y is repeatable enough that a coating deposited on a vertical edge can be suitably controlled to enable useful processing of highly reflective and/or antireflective coatings on vertical edges, and enable use of standard silicon-based materials. The relationship between X and Y may be a ratio or may be some other function wherein knowledge of Y can be used to predict X reliably. Techniques for enabling the use of such coatings and materials include characterizing X and Y for a given material and deposition technique, ensuring that a location where coating thickness is critical is located at a suitable height along the vertical edge, ensuring that proximity and slope effects are controlled or at least known, and using measurements of Y to provide process feedback as needed. Optionally, characterization of X and Y may also include tracking slope of a particular etched geometry, horizontal separation of a vertical edge from adjacent features, a particular height or depth at which X is measured, from the substrate surface or feature top respectively, and/or how the material being processed is presented to the processing equipment (e.g., type of substrate, and/or whether the material is a wafer, a die within a carrier, or some other arrangement). Not all of these techniques are always employed in each instance.

Generating vertical edges that reflective or antireflective coatings are to be deposited on can involve singulating a wafer or other substrate to form individual chips (e.g., as in FIG. 1A) or photonic die (as in FIG. 1B). This can create a processing challenge in that most semiconductor processing equipment is set up for processing whole wafers, not singulated chips. In further embodiments, this challenge is addressed by creating "pocket" wafers that are adapted to carry singulated photonic die in and out of processing equipment, and present the photonic die suitably for processing of the vertical edges.

Figure 4:
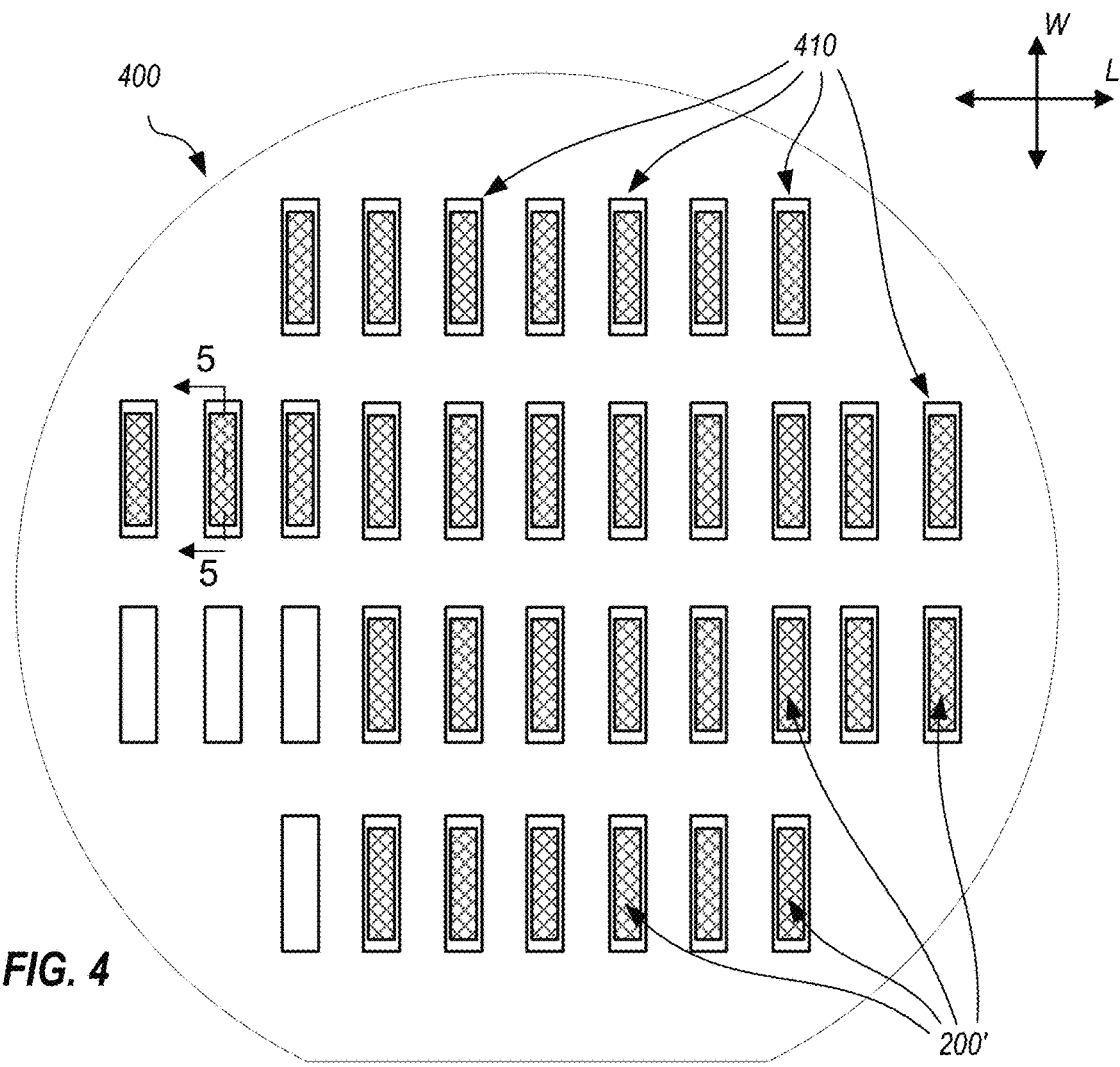
FIG. 4 illustrates an example of a pocket wafer with photonic die in the pockets provided, according to one or more embodiments.
Figure 5:
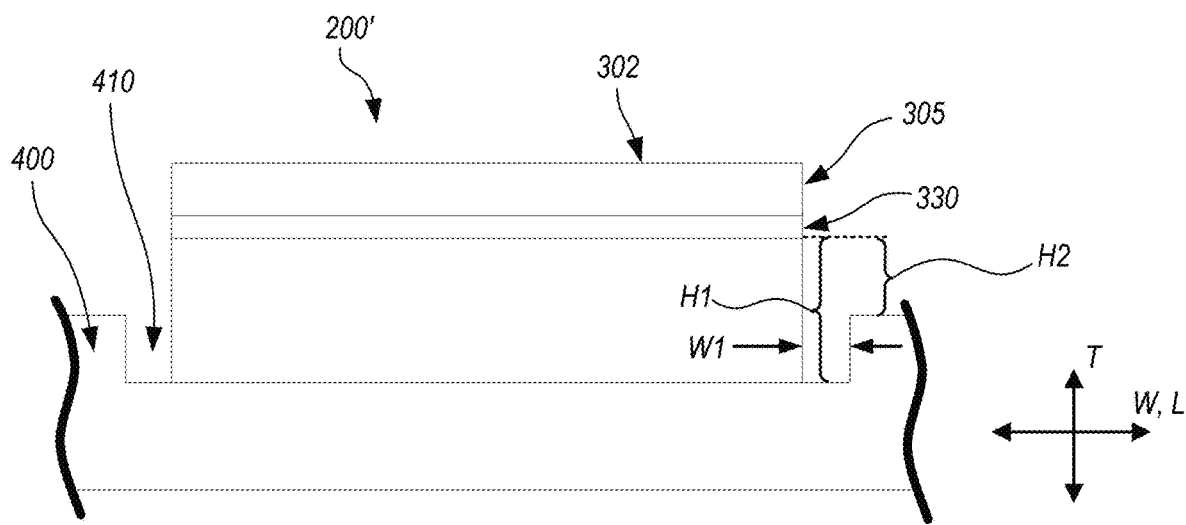
FIG. 5 illustrates a single photonic die in one pocket, in a cross-sectional plane indicated by a sight line through one pocket in the pocket wafer of FIG. 4, according to one or more embodiments.

FIG. 4 illustrates an example of a pocket wafer 400 with photonic die 200' in many pockets 410 formed in wafer 400. Because FIG. 4 is a plan view, axis T is not shown (the T direction is in and out of the plane of FIG. 4). Pockets 410 are advantageously slightly larger in length and width than photonic die 200', so that photonic die 200' can easily fit into pockets 410, yet pockets 410 remain small enough to provide a large number of such pockets per wafer. FIG. 5 schematically illustrates, in a partial cross-sectional view, a single photonic die 200' in one such pocket 410, in a cross-sectional plane indicated by a sight line 5-5 in FIG. 4 through one pocket 410 in pocket wafer 400. In FIG. 5, the T direction is vertical, and the horizontal direction could be considered either of directions W or L. Pocket wafer 400 as illustrated in FIGS. 4 and 5 can easily be created by a single photolithography and etch step, with a pattern that need not be aligned to any other patterns. When photonic die 200' are ready for transfer into the pockets shown, they may be transferred with standard pick and place equipment (not all pockets 410 need have a photonic die 200 within them, as shown in FIG. 5). Each photonic die 200' presents an upward facing, horizontal surface 302, and vertical edges 305, as shown. Then, the entire pocket wafer 400 and all present photonic die 200' are processed normally to deposit the required layer(s) on the upward-facing horizontal surfaces 302, and all vertical edges 305, of the photonic die 200'. After the layer(s) are deposited, if needed, an anisotropic etch step can be used to remove the layer(s) from horizontal upper surfaces 302 without significantly affecting the coating on the vertical surfaces 305. For example, it may be desirable to remove the coating from horizontal surfaces 302 to allow electrical access to probe pads on horizontal upper surface 302.

The use of pocket wafer 400 as shown in FIGS. 4 and 5 addresses many of the fabrication challenges faced when coating a vertical face of a die. For example, if a deposition process is characterized so as to determine a horizontal spacing at which coatings of adjacent die begin to be affected by proximity of an adjacent die, the pockets can be provided at a distance from one another that is greater than such spacing. Also, as shown in FIG. 5, a depth H1 of each pocket 410 can provide a clearance H2 for a critical feature 330 on vertical edge 305 to be coated (e.g., a location where reflection and/or emission occur) over the pocket wafer surface, so that thickness of a coating over the critical feature can be unaffected by vertical proximity of the pocket wafer surface. This also reduces variations in a width W1 of vertical edge 305 from edges of pocket 410, due to location of photonic die 200' within pocket 410. Yet, the depth of pocket 410 itself can be great enough that when photonic die 200' are simply placed in pockets 410, pocket wafer 400 can be loaded into wafer processing equipment (e.g., with standard wafer handling accessories) without photonic die 200' shaking out of pockets 410. In some embodiments, photonic die 200' can be stabilized within pockets 410 with adhesives, reflowed solder type materials or the like. Of course, some of these techniques may affect the value of thickness X on vertical edges relative to thickness Y on horizontal surfaces. It may be necessary to control or otherwise account for such influences in order to accurately predict what thickness X will result from a measured thickness Y for a given coating.

In addition to providing coatings on vertical edges, certain embodiments herein utilize standard silicon-based materials, and other materials, to form highly reflective and/or antireflective layers. This provides additional leverage to the strategy of utilizing standard wafer fabrication tools and materials. For example, instead of using $TiO_2$, $Ta_2O_5$, and/or $Al_2O_3$ as discussed above, reflective and/or antireflective layers can be formed with materials such as Si, $SiO_2$, $Si_3N_4$, $SiN_X$, $SiO_XN_Y$, SiC, SiCO and others which can be deposited with good control of thickness and composition by such deposition techniques as CVD and PECVD in common use in semiconductor fabrication and processing factories. Refractive indices of some of these materials (at wavelengths of interest, e.g., greater than about 650 nm) are listed in Table 1 below.

TABLE 1

Typical silicon-based and other materials used in semiconductor manufacturing

| Material | Refractive Index | Material | Refractive Index |
|---|---|---|---|
| SiO2 | 1.45 | SiC | 1.9 |
| $SiN_X$ | 2.1-3.5 | SiCO | 1.78 |
| $SiO_XN_Y$ | 1.44-2.1 | Si | 3.5 |
| Ge | 4.0 | $Si_{1-X}Ge_X$ | 3.5-4.0 |
| DLC (Diamond-like Carbon) | 2.0 | GaN | 2.43 |
| Carbon Nanotubes | 1.0-2.7 | Graphene | 3.14 |

Use of the materials above can be particularly advantageous in that refractive indices of $SiN_X$, $SiO_XN_Y$, and certain other materials can be tuned within the ranges noted in Table 1 to provide desirable values for reflective and/or antireflective coatings. In some embodiments, multi-layer antireflective coatings can be replaced by a single layer antireflective coating that has a refractive index at a specific value relative to a refractive index of an emission feature. For example, a Si waveguide having n=3.5 is desirably coated with an antireflective layer having n=1.871, or at least within the range n=1.85 to 1.90, which is within the tuning range of $SiO_XN_Y$. Also, because Fresnel reflections vary according to the difference between refractive indices at an interface, it is advantageous to be able to use materials with large refractive index differences, such as those noted above. Thus, in some embodiments, the number of layers required to achieve a specific reflectivity is considerably less when indices in such a large range become available with present invention, as compared to previously used materials. These techniques for large and easy tuning of refractive index in deposited coatings greatly enhance manufacturability, as compared with prior art materials and/or deposition techniques. For example, with $TiO_2$, $Ta_2O_5$, and/or $Al_2O_3$ as discussed above, it is almost impossible to controllably tune refractive index of the deposited coating. The flexibility provided by refractive index tuning greatly eases design of highly reflective and/or antireflective coatings.

Also, tools that employ techniques such as chemical vapor deposition (CVD) or plasma-enhanced chemical vapor deposition (PECVD) for depositing these materials have been extensively developed to provide good coating thickness uniformity, as required for reflective and/or anti-reflective coatings. Both across-wafer and wafer-to-wafer variations in refractive index are typically controlled within 0.5%, and similar thickness variations are typically controlled within 2%. Furthermore, these Si-based materials exhibit good adhesion, mechanical hardness, resistance to diffusion of unwanted substances, resistance to corrosion and corrosive chemicals, high dielectric strength, and low optical absorption in wavelengths of interest.

Figure 6:
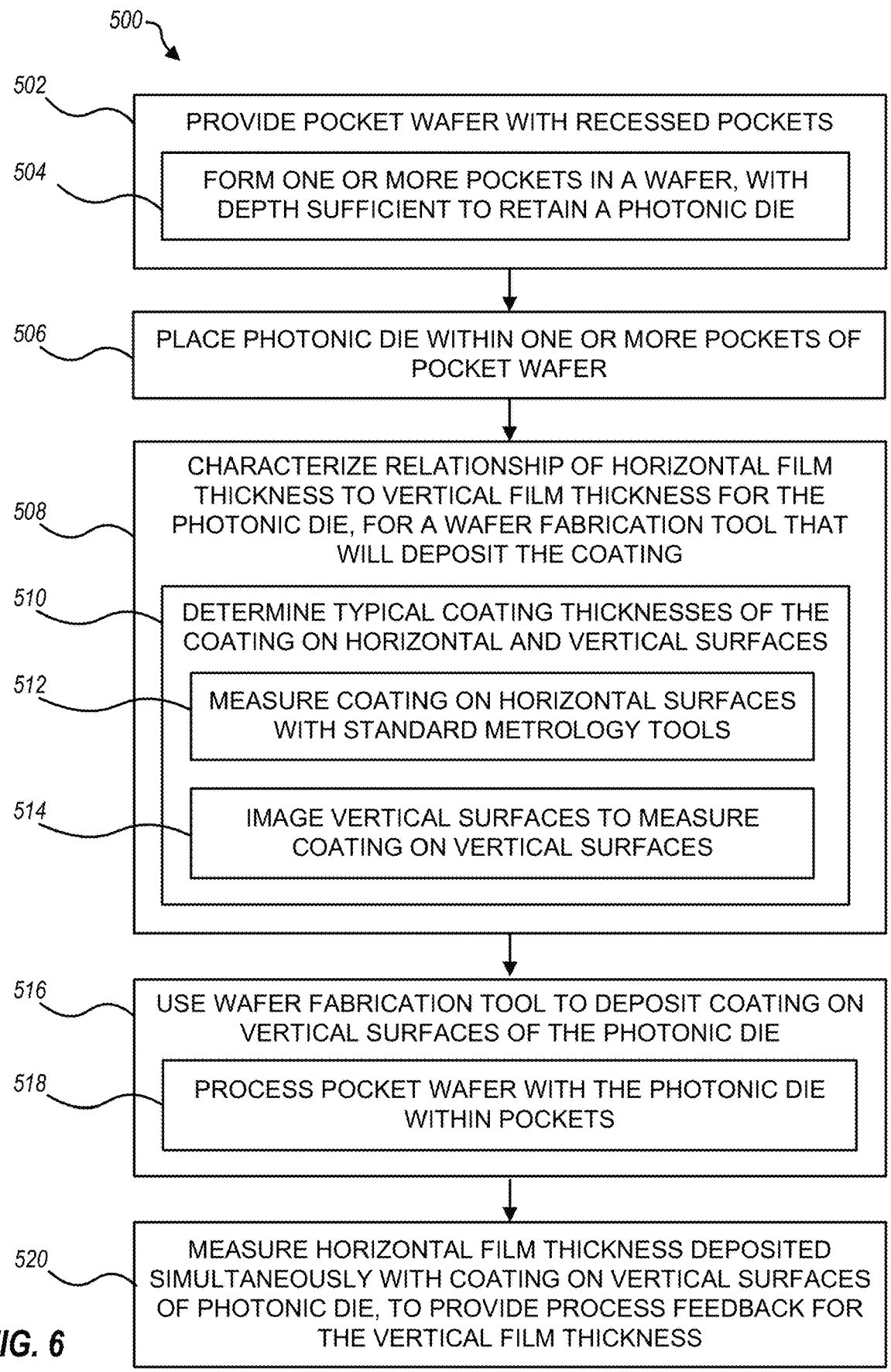
FIG. 6 is a flowchart of a method 500 for depositing a coating on a vertical surface of a photonic die, according to one or more embodiments.

FIG. 6 is a flowchart of a method 500 for depositing a coating on a vertical surface of a photonic die. Step 508 will sometimes be a first step of method 500, but step 508 may be preceded by optional steps 502, 504 and 506 as discussed below. Step 508 characterizes a relationship of horizontal coating thickness to vertical coating thickness for the photonic die, for a wafer fabrication tool that will deposit the coating. An example of step 508 is characterizing a relationship between horizontal coating thickness Y to vertical coating thickness X, as illustrated in FIGS. 2 and 3. A common, but optional, way to perform step 508 is to perform optional step 510, which determines typical coating thicknesses of the coating on horizontal and vertical surfaces. A further common, but optional, way to perform step 510 is to perform optional steps 512 and 514. Step 512 measures an example of the desired coating on a horizontal surface, using standard metrology tools. An example of step 512 is measuring coating thickness Y of coating 300, schematically shown in FIG. 2, or of coating 300' shown in FIG. 3. Step 512 may be performed on an actual photonic die or on another surface that is exposed to the same coating deposition. Step 514 images an example of the desired coating on a vertical surface, in order to measure its thickness. An example of step 514 is imaging coating 300', as shown in FIG. 3, to determine coating thickness X. Step 514 may be performed on an actual photonic die or on another feature that is exposed to the same coating deposition.

Once the relationship of horizontal coating thickness to vertical coating thickness for the photonic die (e.g., Y to X as discussed above) for the wafer fabrication tool that will deposit the coating is known from step 508, step 516 uses the wafer fabrication tool to deposit the coating on vertical surfaces of the photonic die. A common, but optional step 518 is discussed below. Step 520 measures horizontal coating thickness deposited simultaneously in step 516, to provide process feedback for the vertical thickness deposited, using the relationship characterized in step 508. Examples of steps 516 and 520 include depositing a coating on one or more photonic die, measuring thickness of a coating deposited on a horizontal surface of the photonic die, and using the relationship characterized in step 508 to indirectly determine the thickness of the coating on vertical surfaces of the photonic die. After step 508 is initially performed, it becomes an optional step; that is, once the relationship of horizontal coating thickness to vertical coating thickness is known, it need not be validated during each performance of method 500. However, based on results and ongoing engineering and quality control judgment, it would certainly be possible to repeat step 508 as often as deemed necessary.

Steps 502, 504, 506 and 518 are optional steps of method 500 that relate to use of a pocket wafer to present photonic die to a standard wafer fabrication tool for processing, as shown and discussed in connection with FIGS. 4 and 5 above. Steps 502, 504 and 506 would be performed as part of method 500, at least before step 516 and possibly before step 508. Step 518 would be performed as a mode of performing step 516. Optional step 502 provides a pocket wafer with recessed pockets for presenting photonic die to a standard wafer fabrication tool for processing. In some performances of method 500, the pocket wafer would already be available, and when not, optional step 504 would create the pocket wafer by forming one or more pockets in a wafer, each pocket having a depth sufficient to retain the intended photonic die. An example of step 504 include patterning and etching a wafer with an arrangement of pockets 410 therein, to form pocket wafer 400, as shown in FIG. 4. Care would be taken that a depth of each pocket is sufficient to retain the intended photonic die (e.g., through wafer loading and unloading cycles) as shown and discussed in connection with FIG. 5. Optional step 506 places photonic die for processing within one or more pockets of the pocket wafer. When a pocket wafer is to be used, it is not strictly necessary to perform step 506 before step 508, but it would usually be performed because use of a pocket wafer could affect the relationship of horizontal to vertical coating thicknesses characterized in step 508. When step 506 is performed, step 516 is performed as step 518, that is, once the photonic die are placed within the pocket wafer, that wafer and the photonic die would be used while the wafer fabrication deposits the coating.

B. Angled Laser Facet

FIGS. 7A-7G are cross-sectional diagrams of a semiconductor laser 700 at various stages of its fabrication, according to one or more embodiments. In FIGS. 7A-7G, the T direction is vertical, and the horizontal direction could be considered either of directions W or L. The fabrication of the semiconductor laser 700 is based on the wafer-scale integration of the coating process described above (e.g., the method 500 shown in FIG. 6). It should be understood that although a silicon-photonic-based laser device is used as an example, the fabrication process may also be tuned for other material platforms such as compound-semiconductor-based laser devices.

Figure 7A:
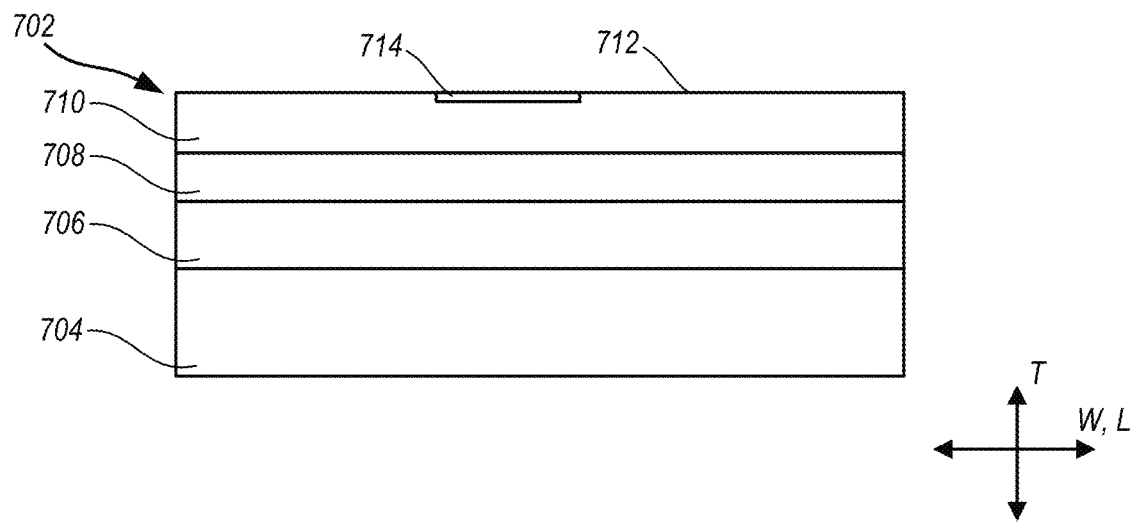
FIGS. 7A-7G are cross-sectional diagrams of a semiconductor laser at various stages of its fabrication, according to one or more embodiments.

In the example shown in FIG. 7A, a processed wafer 702 is provided, and the processed wafer 702 includes, among other things, a substrate 704, a bottom dielectric layer 706 on the substrate 704, a guiding layer 708 on the bottom dielectric layer 706, and a top dielectric layer 710 on the guiding layer 708. In one example, the substrate 704 is a silicon substrate. In another example, the substrate 704 is a compound semiconductor substrate. In yet another example, the substrate 704 is a silicon on insulator (SOI) substrate, which includes a buried oxide (BOX) layer and a silicon handle wafer, among other things.

In one example, the bottom dielectric layer 706 and the top dielectric layer 710 are made of a low index dielectric. In some implementations, the guiding layer 708 is a silicon guiding layer. In some implementations, the guiding layer 708 is a high index guiding layer. In some implementations, the guiding layer is selectively etched to form a waveguide, on which the top dielectric layer 710 is formed. In some examples, the waveguide has a rectangular shape. In some configurations, the waveguide is a ridge waveguide.

In some embodiments, the guiding layer is crystalline silicon, and/or a III-V chip is used as a gain medium for the laser. The '785 application, commonly owned, describes a gain chip bonded to (e.g., within a recess of) a silicon platform. The processed wafer 702 in the instant disclosure could be the structure shown in FIG. 19 in the '785 application. In another, non-exclusive example, the guiding layer 708 in the instant disclosure could be the device layer 120 in commonly owned U.S. patent application Ser. No. 16/914,156, filed on Jun. 26, 2020, which is incorporated by reference for all purposes. The chip 104 in the '156 application is optically aligned with the device layer 120 in the '156 application. The chip 104 in the '156 application is the gain medium for a laser and sometimes referred to as a gain chip. The output of the laser in the '156 application is to the left of grating 140, as shown in FIG. 1 in the '156 Application, wherein the grating 140 is the output coupling mirror for the laser in the '156 application.

A gain chip can also have an etched facet (e.g., an etched facet in the III-V material), in addition to the output surface of the laser having an etched facet (e.g., the silicon device layer being etched). A gain chip having an etched facet is described in commonly owned U.S. patent application Ser. No. 16/690,483, filed on Nov. 21, 2019 and U.S. patent application Ser. No. 15/592,704, filed on May 11, 2017, which are incorporated by reference for all purposes. Accordingly, there can be a first angled facet (e.g., an etched facet) on a gain chip (e.g., a III-V gain chip) and a second angled facet (e.g., an etched facet) in the platform (e.g., in a crystalline silicon device layer of an SOI wafer). The angle of the second angled facet is not the same as the angle of the first angled facet, in some configurations. In some configurations, the platform has only one angled facet per laser output, and the gain chip has two angled facets per laser. The platform has only one angled facet, per laser output, because one or more mirrors are used as back reflectors, and the back reflectors have nearly 100% reflectivity. For example, a facet between the optical output 164 and the optical fiber 168 in U.S. patent application Ser. No. 15/426,823, filed on Feb. 7, 2017, which in incorporated by reference for all purposes, could be etched to be an angled output of the laser; and/or facets on gain chips 104 could also be etched to be angled.

In the example shown in FIG. 7A, a probing pad 714 is located on the top surface 712 of the top dielectric layer 710. Although only one probing pad 714 is shown in the example shown in FIG. 7A, it should be understood that multiple probing pads 714 may be located on the top surface 712 of the top dielectric layer 710 and/or extend to the guiding layer 708, in other examples.

Figure 7B:
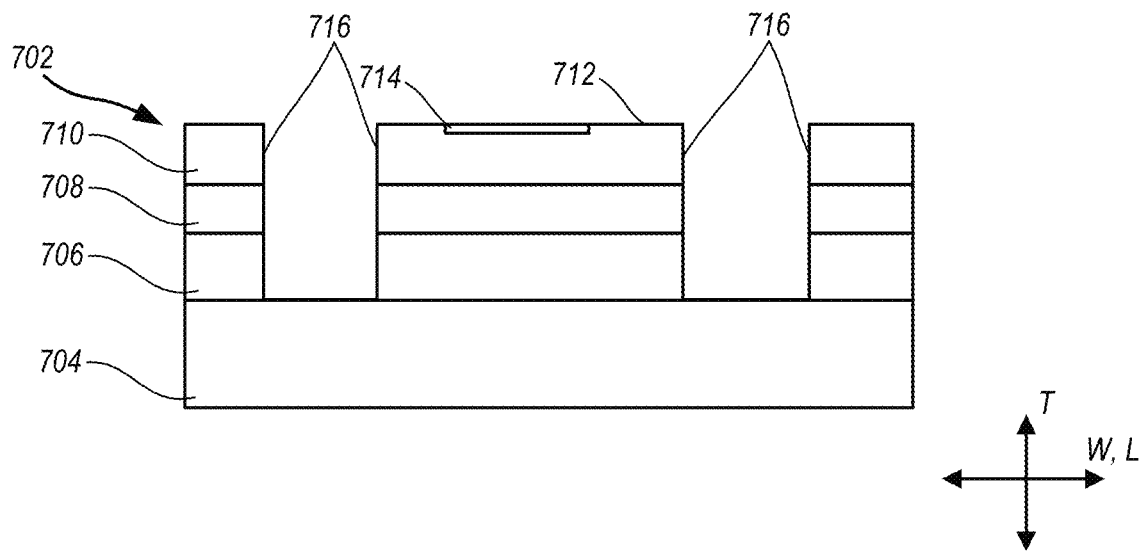

In the example shown in FIG. 7B, the processed wafer 702 is selectively etched (by patterning the processed wafer 702), and laser facets 716 are formed. The laser facets are vertical (i.e., perpendicular to the horizontal plane). The top dielectric layer 710, the guiding layer 708, and the bottom dielectric layer 706 are etched after a lithography process. Trenches are formed in the processed wafer 702, and each trench has its bottom surface and the laser facets 716. In one implementation, the top dielectric layer 710, the guiding layer 708, and the bottom dielectric layer 706 are etched by a single etch step, since the top dielectric layer 710, the guiding layer 708, and the bottom dielectric layer 706 can be etched by the same set of etching gases, though at different rates. For instance, for a silicon-photonic-based laser device, the guiding layer 708 is made of silicon, whereas the bottom dielectric layer 706 and the top dielectric layer 710 are made of silicon dioxide, and they can be etched with fluorine-based chemicals. As shown in FIG. 7B, laser facets 716 are formed after etching the processed wafer 702. The laser facets 716 are perpendicular to the horizontal plane (i.e., the W-L plane). In some implementations, the surface-roughness of the laser facets is low enough (e.g., root mean square (RMS) of the profile height deviations from the mean line is 2 to 5 nm) to not have a noticeable effect on the spatial coherence of the output light.

Figure 7C:
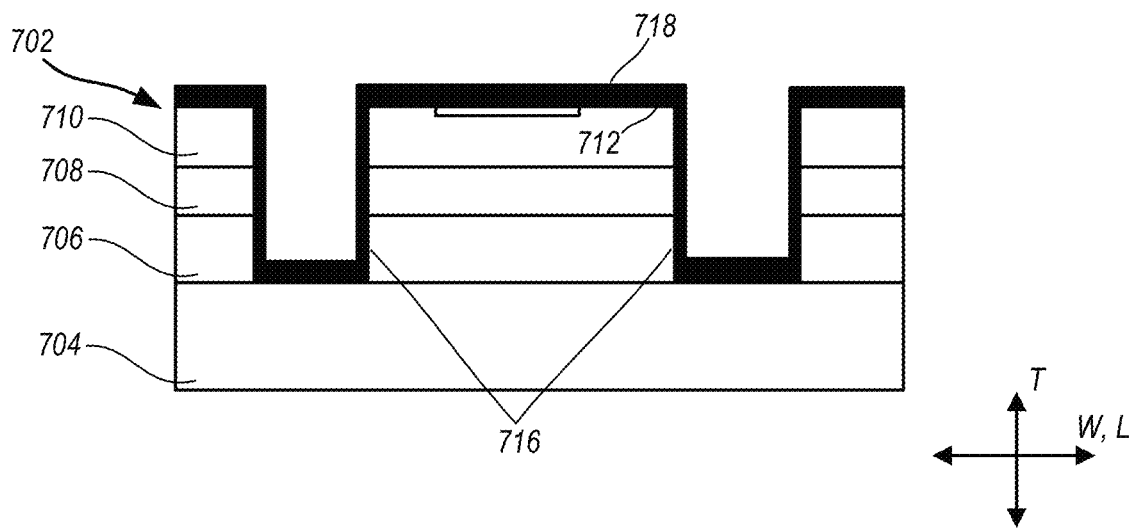

In the example shown in FIG. 7C, a coating 718 is deposited, and the coating 718 covers the top surface 712 of the top dielectric layer 710, the laser facets 716, and the bottom surfaces of the trenches. As explained above with reference to FIGS. 2 and 5, the relationship of the horizontal film thickness to the vertical film thickness for a wafer fabrication tool that will deposit the coating is characterized, and the horizontal film thickness deposited is measured simultaneously to provide process feedback for the vertical film thickness.

In some implementations, the coating 718 is a highly reflective coating. In other implementations, the coating 718 is an antireflective coating. In some embodiments, the antireflective coating consists exclusively of silicon-based materials. In some embodiments, the silicon-based materials include one or more of Si, $SiO_2$, $SiN_X$, $SiO_XN_Y$, SiC, or SiCO. In some implementations, the coating 718 is a single layer. In some implementations, the coating 718 includes multiple layers. It should be understood that these examples are not intended to be limiting.

Figure 7D:
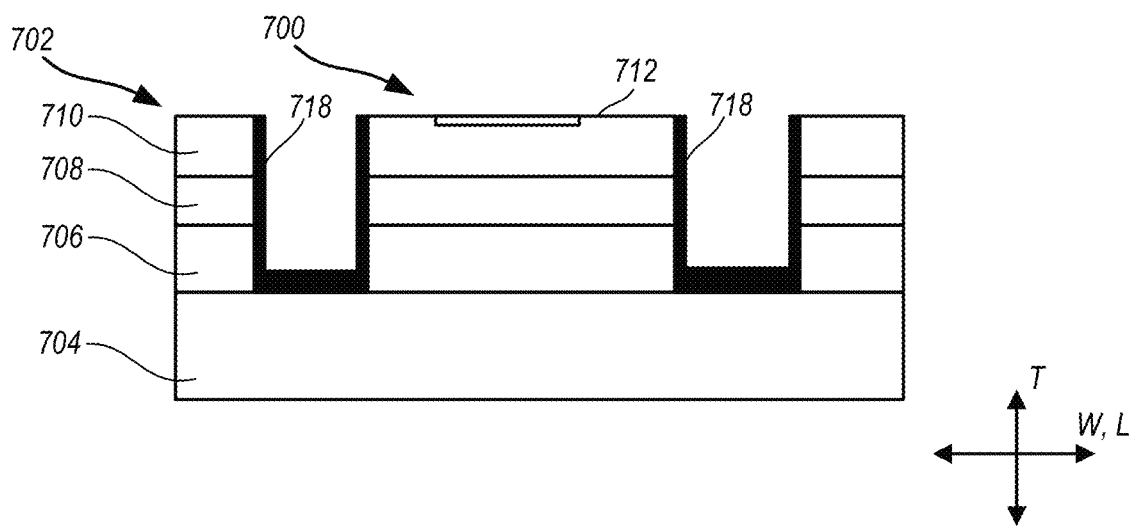

In the example shown in FIG. 7D, the coating 718 is removed from the top surface 712 of the top dielectric layer 110. In this example, a blanket etch process is conducted. Since the horizontal etch rate is higher than the lateral etch rate, the coating 718 on the laser facets 716 remain while the coating 718 on the top surface 712 is removed.

Figure 7E:
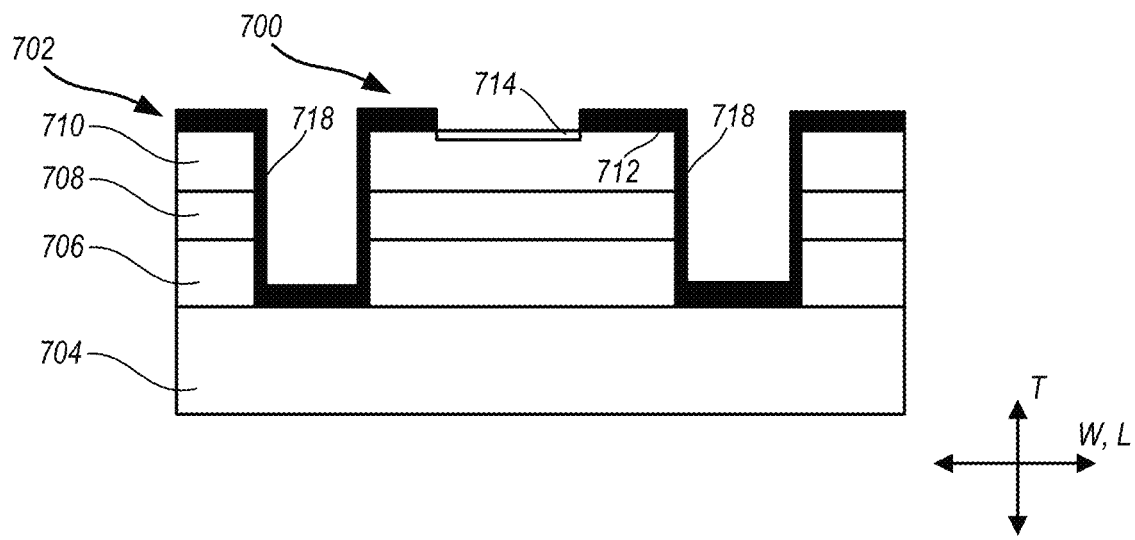

In the example shown in FIG. 7E, the coating 718 is removed from the top surface 712 of the top dielectric layer 110. Different from the example shown in FIG. 7D, a lithography process is conducted before the etch step. As a result, only the coating 718 that is atop the probing pad 714 is removed. The probing pad 714 is, therefore, exposed. Since the coating 718 on the top surface 712 is not removed except the portion that is atop the probing pad 714, a subsequent passivation process can be simplified.

Figure 7F:
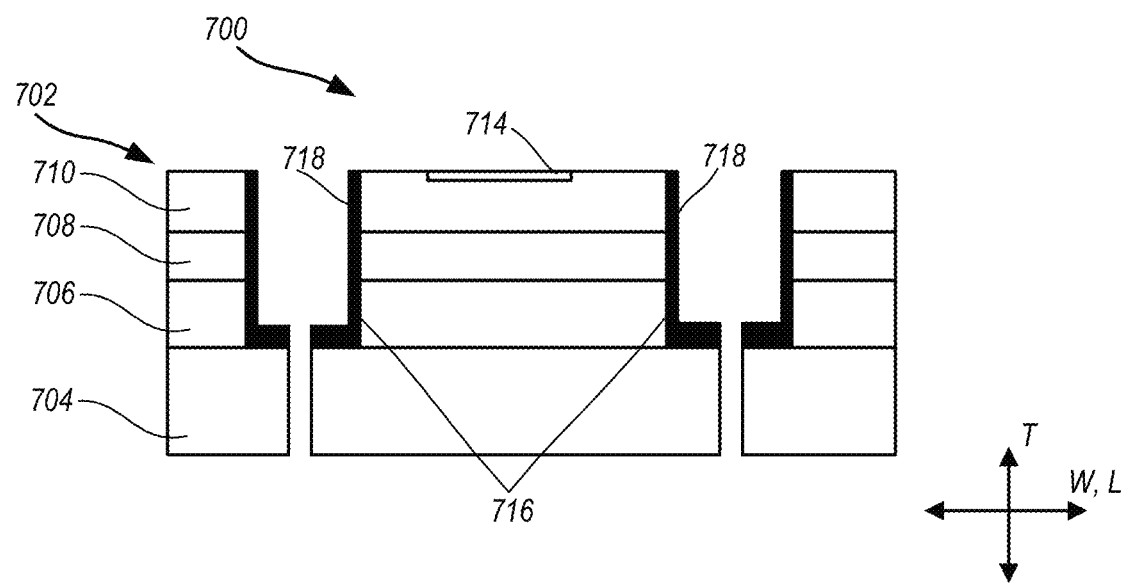

In the example shown in FIG. 7F, the processed wafer 702 is diced into individual semiconductor lasers 700. In one implementation, the processed wafer 702 is diced using a dicing saw. In another implementation, the processed wafer 702 is diced using a cleaving tool. Although only one semiconductor laser 700 is illustrated in FIG. 7G, it should be understood that multiple semiconductor lasers 700 arranged, for example, in the W direction or the L direction are singulated.

Figure 7G:
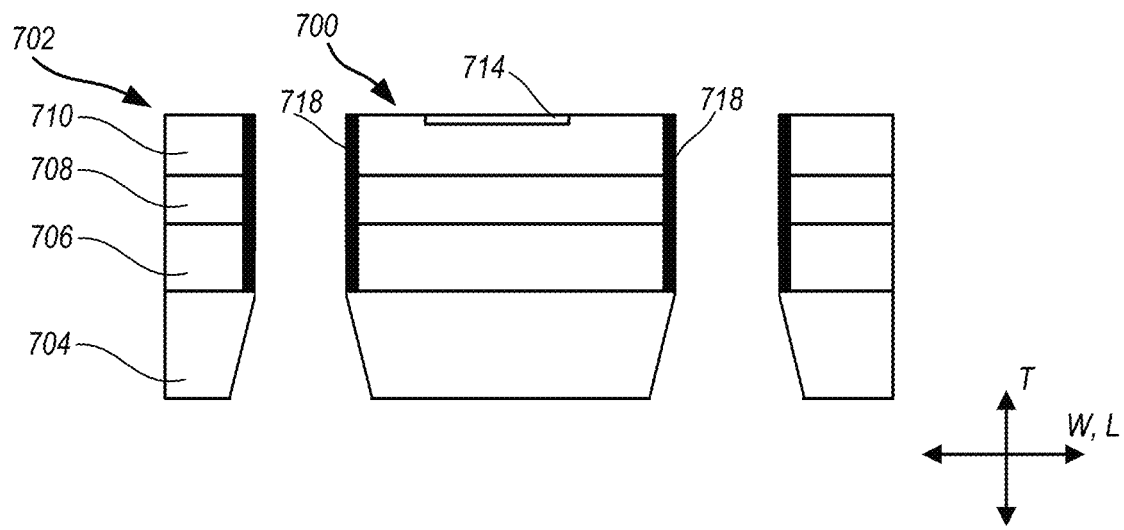

In the example shown in FIG. 7G, the processed wafer 702 is segmented (e.g., diced, cleaved, or etched) into individual semiconductors 700 using a backside etch process. The substrate 704 is etched through. In some implementations, the substrate 704 is etched using a selective wet etching process. In some implementations, the substrate 704 is etched using a Bosch process (also referred to as a "pulsed or time-multiplexed etching process").

It should be understood that although the examples shown in FIGS. 7F and 7G correspond to the blanket etching process shown in FIG. 7D, the dicing steps shown in FIGS. 7F and 7G are also applicable to the etching process shown in FIG. 7E.

In some embodiments, integrating coating into the wafer-level process, as described above, also allows decoupling a dicing angle from a laser facet angle. The dicing angle is the angle at which the substrate facet is formed, for example, by dicing, cleaving, etching, etc., whereas the laser facet angle is the angle at which the laser facet is formed. In some occasions, the substrate facet may be referred to as the first facet, whereas the laser facet may be referred to as the second facet.

Figure 8:
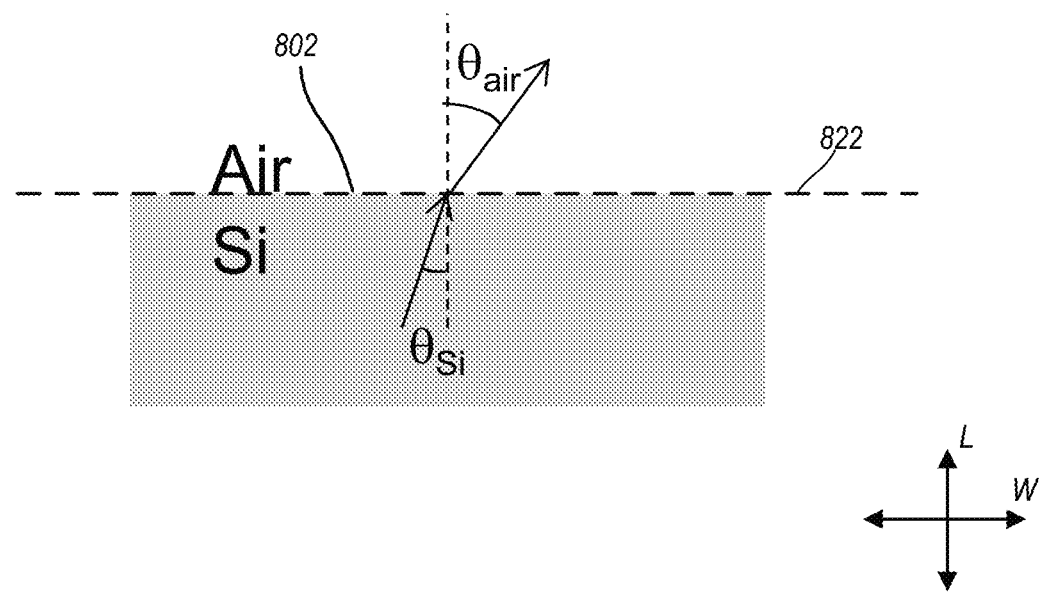
FIG. 8 is a schematic plan view of Fresnel refraction at a silicon-air interface without an angled laser facet, according to one or more embodiments.
Figure 9:
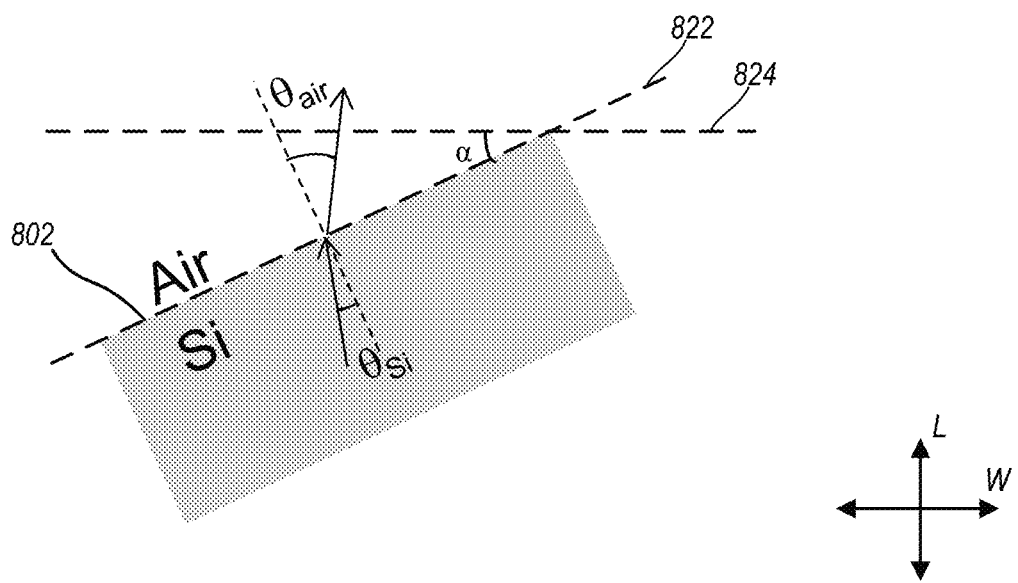
FIG. 9 is a schematic plan view of Fresnel refraction at a silicon-air interface with an angled laser facet, according to one or more embodiments.

FIG. 8 is a schematic plan view of Fresnel refraction at a silicon-air interface without an angled laser facet, according to one or more embodiments. FIG. 9 is a schematic plan view of Fresnel refraction at a silicon-air interface with an angled laser facet, according to one or more embodiments. As shown in FIG. 8, a laser facet 802 is the silicon-air interface, and the light propagates, in accordance with Snell's law, in the directions as indicated by the arrows shown in FIG. 8. The incident angle is $\theta_{Si}$, whereas the refractive angle is $\theta_{air}$. The laser facet angle is illustrated as the dashed line 822. On the other hand, the substrate facet, which is vertical, is formed at the same angle as the laser facet angle. In other words, the dicing angle is the same as the laser facet angle, both illustrated as the dashed line 822. That is, the dicing angle and the laser facet angle are "coupled."

As shown in FIG. 9, the dicing angle can be "decoupled" from the laser facet angle. The laser facet 802 is the silicon-air interface, and the light propagates, in accordance with Snell's law, in the directions as indicated by the arrows shown in FIG. 9. The laser facet angle is illustrated as the dashed line 822. The substrate facet is formed, however, at a different angle from the laser facet angle. The dicing angle is illustrated as the dashed line 824 shown in FIG. 9. The laser facet angle and the dicing angle intersect with an angle α. That is, the dicing angle is "decoupled" from the laser facet angle, the benefits of which will be described below.

In a conventional dicing-polishing-coating process, the dicing angle is the same as the laser facet angle, as shown in FIG. 8. In order to reduce reflections from the silicon-air interface 802 that travel back into the cavity, it is desired to choose a relatively large incident angle $\theta_{Si}$. However, a relatively large incident angle $\theta_{Si}$ results in a relatively large refractive angle $\theta_{air}$. A relatively large refractive angle $\theta_{air}$ puts additional constraints on subsequent packaging and makes it challenging to couple the refractive light to, for example, an optical fiber or lenses.

By decoupling the dicing angle from the laser facet angle, as shown in FIG. 9, it is possible to choose a relatively large incident angle $\theta_{Si}$ and still have the refractive light coming out substantially perpendicular to the substrate facet, making it easier for subsequent packaging and coupling to optical fibers or lenses. In some embodiments, "substantially perpendicular" means no greater than ±1, 2, 3, 4, or 5 degrees deviated from the right angle (i.e., 90°). In the example shown in FIG. 9, since the laser facet is at an angle α (i.e., angled) relative to the substrate facet, the refractive light, relative to the substrate facet, can be considered as being the refractive angle $\theta_{air}$ offset by the angle α. As such, the refractive light coming out can be substantially perpendicular to the substrate facet. That is, the angle is chosen such that the output light is substantially perpendicular to the vertical substrate facet. Therefore, a larger incident angle $\theta_{Si}$ can be used when the laser facet 802 is angled, as compared to when the laser facet 802 is not angled, thus reducing the reflections back into the cavity. An example relationship between the incident angle, the refractive angle, and the reflections back into the cavity is shown in Table 2 below.

TABLE 2

Example relationship between the incident angle, the refractive angle, and the reflections back into the cavity

| $\Theta_{Si}$ (deg) | $\theta_{air}$ (deg) | Reflection (M1) | Reflection (dB) |
|---|---|---|---|
| 0 | 0 | 0.3373 | −4.72 |
| 2 | 6.96 | 0.2361 | −6.27 |
| 4 | 14.01 | 0.0881 | −10.55 |
| 6 | 21.27 | 0.0202 | −16.95 |
| 8 | 28.88 | 0.0026 | −25.89 |
| 10 | 37.05 | 0.0002 | −37.63 |

As shown in Table 2, when the incident angle $\theta_{Si}$ is 8°, the refractive angle is 28.88°, and the reflection is −25.89 dB. By choosing the incident angle $\theta_{Si}$ to be 8°, the reflection back into the cavity is reduced to −25.89 dB. A typical antireflective coating specification calls for a reflection smaller than −30 dB. Therefore, by choosing the incident angle $\theta_{Si}$ to be 8°, the additional reflection requirement for the coating is only about −5 dB (i.e., the difference between −30 dB and −25.89 dB), which significantly relaxes the requirement for the antireflective coating. In another example, when the incident angle $\theta_{Si}$ is 10°, the refractive angle is 37.05°, and the reflection is −37.63 dB. By choosing the incident angle $\theta_{Si}$ to be 10°, the reflection back into the cavity is reduced to −37.63 dB, which is smaller than −30 dB without any contribution from the coating. In summary, choosing relatively large incident angles $\theta_{Si}$ can reduce requirements on the antireflection coating, as it is the total reflection back into the cavity that matters. In some implementations, the thickness of the antireflective coating is designed based on the angle α. The reduced requirements on the antireflection coating can help improve the yield of the semiconductor laser devices.

In one example, the angle α is between 2° and 40°. When the angle α is 40°, it is capable of offsetting any refractive angle $\theta_{air}$ shown in Table 2. In another example, the angle α is between 6° and 30°. In yet another example, the angle α is between 14° and 22°. It should be understood that these examples are not intended to be limiting.

However, the downside of choosing a relatively large incident angle $\theta_{Si}$ is a relatively large refractive angle $\theta_{air}$, which makes the subsequent packaging and coupling to optical fibers or lenses challenging. The angled laser facet according to some embodiments described above can address this large refractive angle issue by offsetting the large refractive angle.

Figure 10:
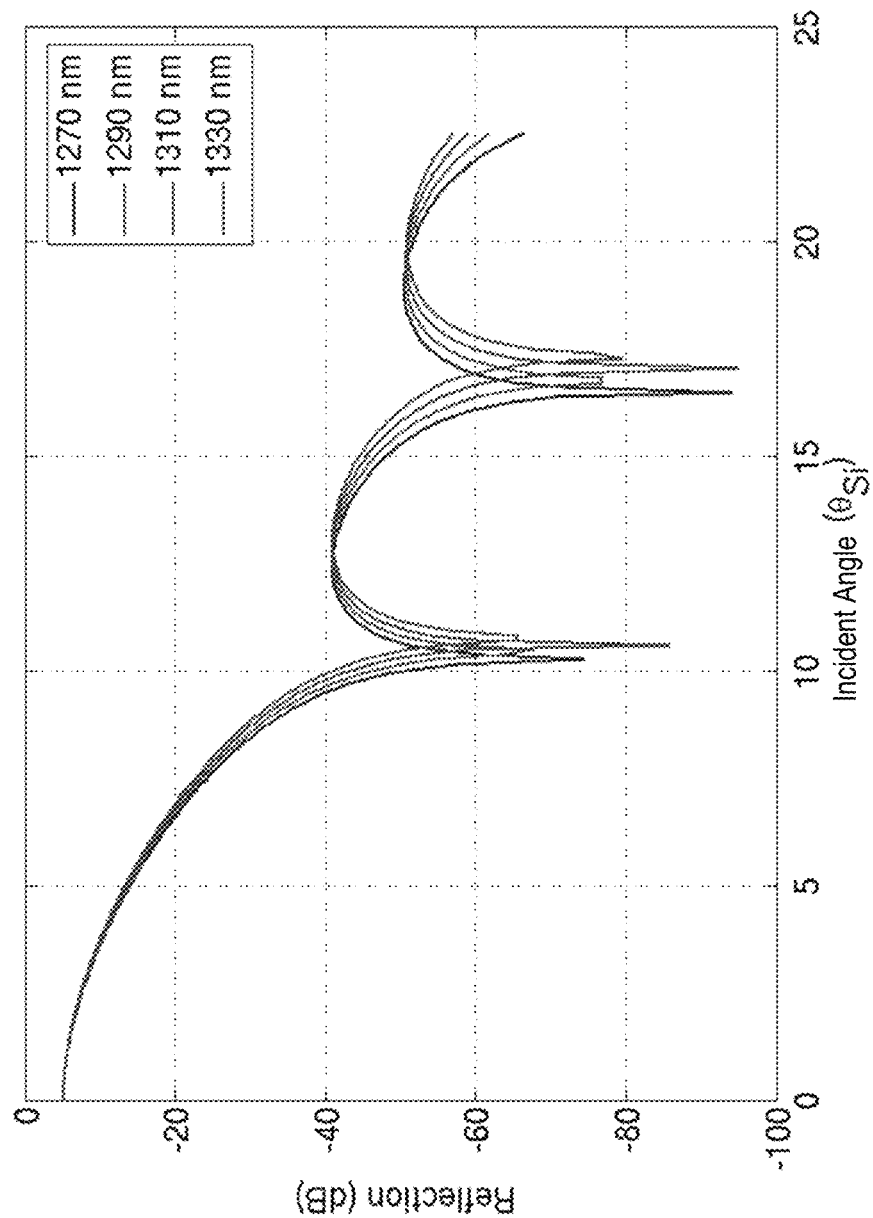
FIG. 10 is a diagram illustrating an example relationship between the incident angle and the reflection, according to one or more embodiments.

FIG. 10 is a diagram illustrating an example relationship between the incident angle and the reflection, according to one or more embodiments. The example relationship shown in FIG. 10 corresponds to a ridge waveguide that is 1.75 µm wide and 1.5 µm thick. Reflection is measured for different wavelengths (i.e., 1270 nm, 1290 nm, 1310 nm, and 1330 nm). In this example, by using the incident angle $\theta_{Si}$, which is 7.5°, the requirement on the antireflective coating would only be −5 dB to meet the −30 dB typical specification or −15 dB to meet a −40 dB stricter specification. When the incident angle $\theta_{Si}$ is 10°, the reflection back into the cavity is smaller than −40 dB for all wavelengths. Therefore, the requirement for an antireflective coating can be eliminated, or a coating with a significantly relaxed specification can be. It should be understood that although a ridge waveguide is used as an example, the methodology is also applicable to other waveguide shapes.

Figure 11:
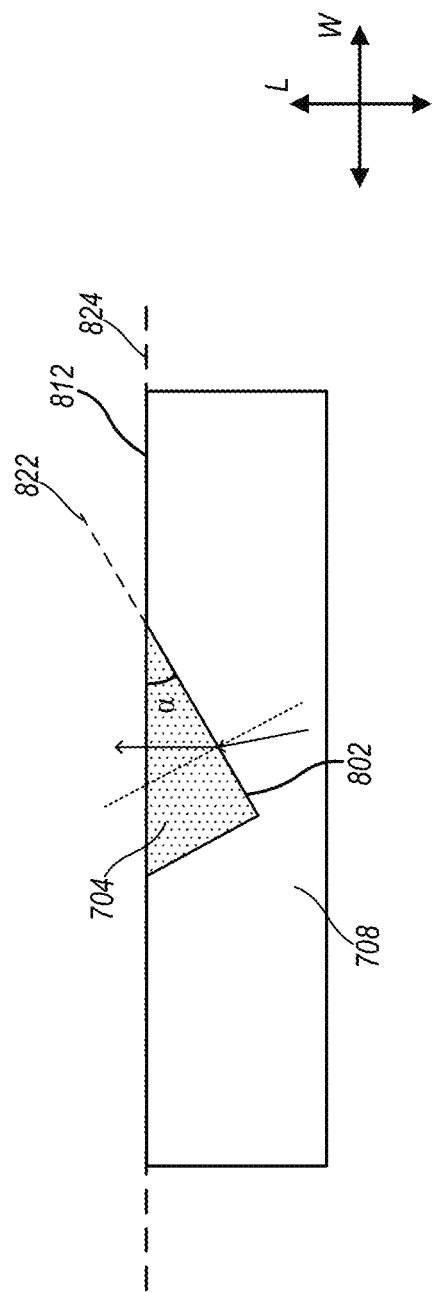
FIG. 11 is a schematic plan view of a wafer having one semiconductor laser device, according to one or more embodiments.

FIG. 11 is a schematic plan view of a wafer having one semiconductor laser device, according to one or more embodiments. In the example shown in FIG. 11, the lacer facet 802 is etched using a laser facet angle illustrated as the dashed line 822, whereas the substrate facet 812 is etching using a dicing angle 824 illustrated as the dashed line 824. The laser facet angle and the dicing angle intersect with an angle α. In the triangular region in the W-L plane, the substrate 704 is exposed due to the angled laser facet 802. In other regions in the W-L plane, the guiding layer 708 is above the substrate 704 (other layers above the guiding layer 708 are not shown for ease of illustration). As shown in FIG. 11, the light coming out of the laser facet 822 is substantially perpendicular to the substrate facet 824 because of the angled laser facet 802. The angled laser facet 802 is fabricated at the location where the light is coupled to, for example, an optical fiber or lenses.

Figure 12:
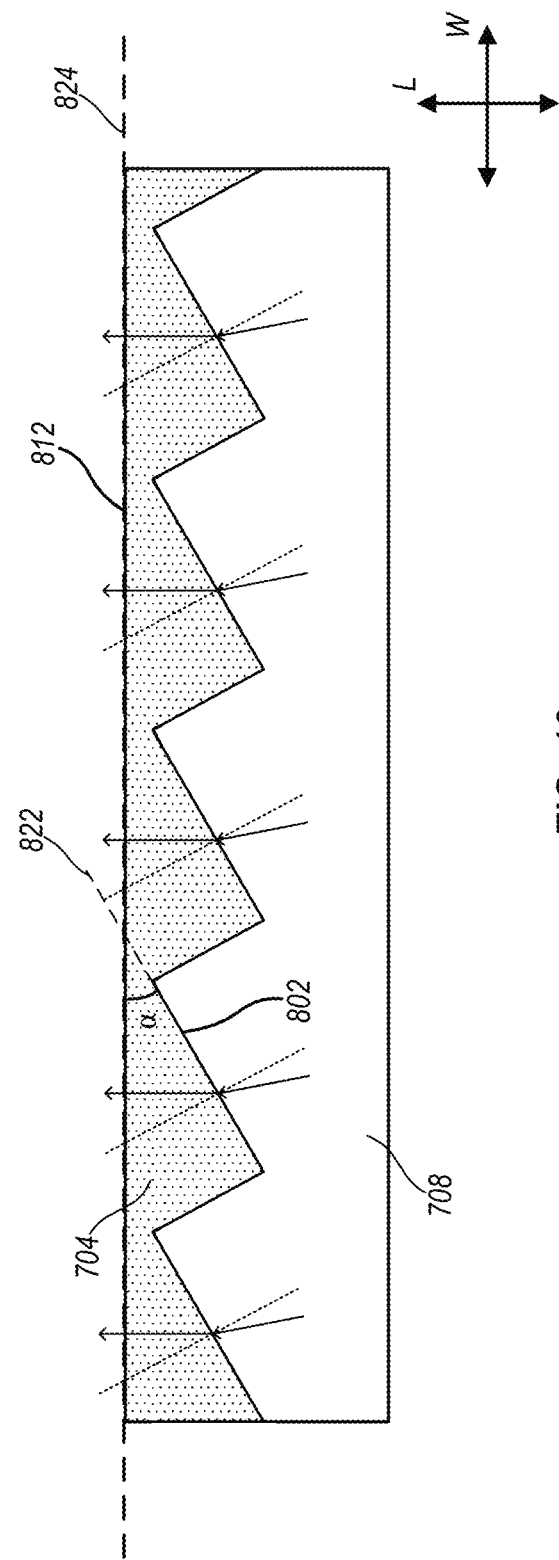
FIG. 12 is a schematic plan view of a wafer having multiple semiconductor laser devices, according to one or more embodiments.

FIG. 12 is a schematic plan view of a wafer having multiple semiconductor laser devices, according to one or more embodiments. In the example shown in FIG. 12, multiple laser facets are formed, and multiple (also referred to as "a bar of") semiconductor laser devices are fabricated. For each of the multiple semiconductor laser devices, the lacer facet 802 is etched using a laser facet angle illustrated as the dashed line 822, whereas the substrate facet 812 is etching using a dicing angle 824 illustrated as the dashed line 824. The laser facet angle and the dicing angle intersect with an angle α. In certain regions in the W-L plane, the substrate 704 is exposed due to the angled laser facets 802. In other regions in the W-L plane, the guiding layer 708 is above the substrate 704 (other layers above the guiding layer 708 are not shown for ease of illustration). As shown in FIG. 11, the light coming out of each of the multiple laser facets 822 is substantially perpendicular to the substrate facet 824 because of the angled laser facets 802, making it easier for subsequent packaging and coupling while still possible to achieve the reflection in accordance with a typical specification.

Figure 13:
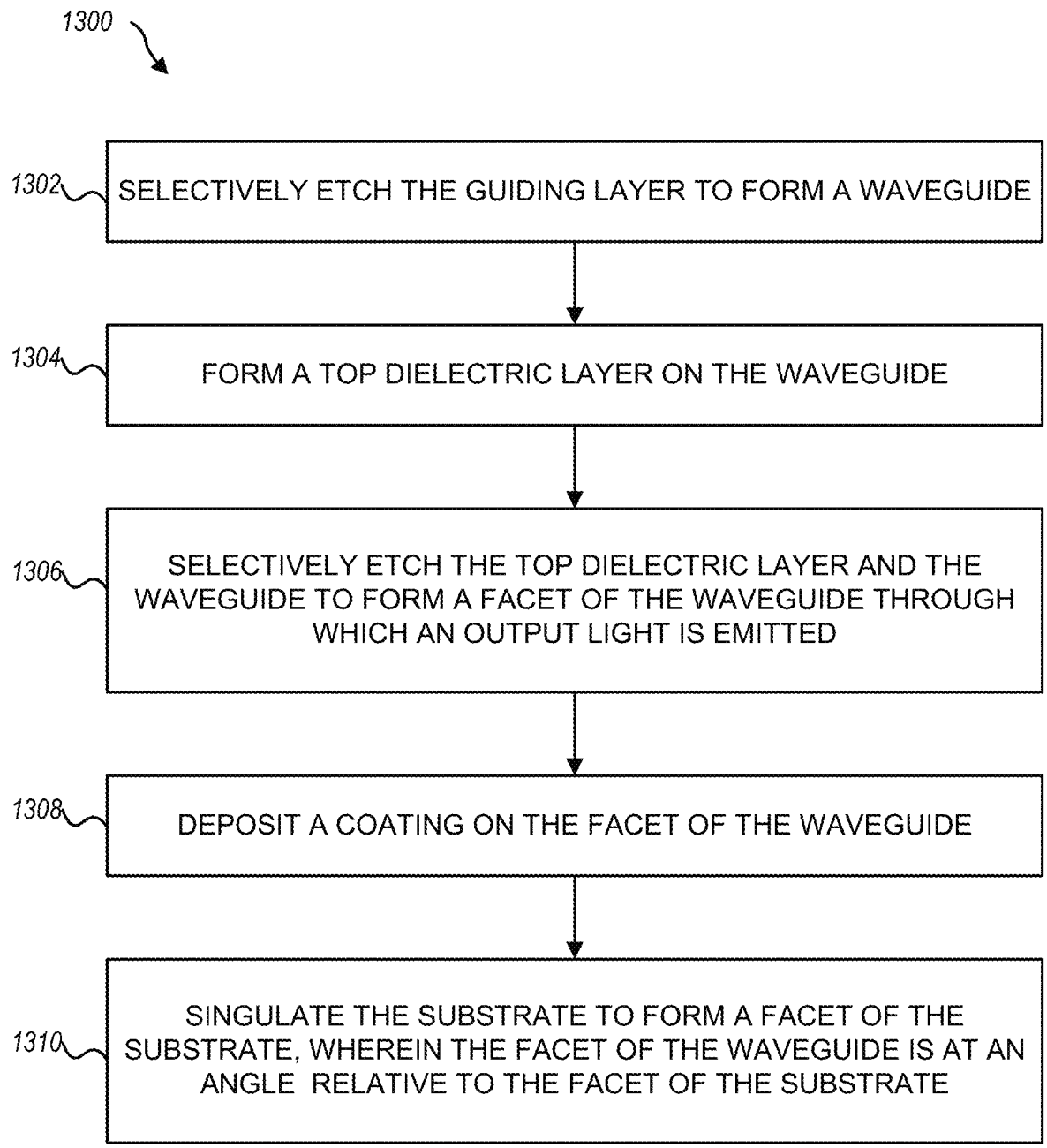
FIG. 13 is a flowchart of a method 1300 for fabricating a semiconductor laser device, according to one or more embodiments.

FIG. 13 is a flowchart of a method 1300 for fabricating a semiconductor laser device, according to one or more embodiments. It should be understood that there may be additional steps prior to step 1302. Examples of those additional steps include processing a substrate or a wafer, forming a bottom dielectric layer, forming a guiding layer, and the like.

At step 1302, the guiding layer (e.g., the guiding layer 708 shown in FIG. 7A) is selectively etched to form a waveguide. At step 1304, a top dielectric layer (e.g., the top dielectric layer 710 shown in FIG. 7A) is formed on the waveguide. At step 1306, the top dielectric layer and the waveguide are selectively etched to form a facet (e.g., the vertical laser facets 716 shown in FIG. 7F) of the waveguide through which an output light is emitted. In some embodiments, the bottom dielectric layer is also selectively etched at step 1306. At step 1308, a coating (e.g., the coating 718 shown in FIG. 7F) is deposited on the facet of the waveguide. At step 1310, the substrate is singulated to form a facet (e.g., the substrate facet 812 shown in FIG. 12) of the substrate. The facet of the waveguide is at an angle (e.g., the angle α shown in FIG. 12) relative to the facet of the substrate.

The foregoing is provided for purposes of illustrating, explaining, and describing embodiments of the present invention. Upon reading and comprehending the present disclosure, one of ordinary skill in the art will readily conceive many equivalents, extensions, modifications, adaptations and alternatives. These equivalents, extensions, modifications, adaptations and alternatives may be made without departing from the scope or spirit of the invention. Different arrangements of the components depicted in the drawings or described above, as well as components and steps not shown or described, are possible. Similarly, some features and subcombinations are useful and may be employed without reference to other features and subcombinations.

The above description of exemplary embodiments of the invention has been presented for the purposes of illustration and description. It is not intended to be exhaustive or to limit the invention to the precise form described, and many modifications and variations are possible in light of the teaching above. Embodiments of the invention have been described for illustrative and not restrictive purposes, and alternative embodiments will become apparent to readers of this patent. The embodiments were chosen and described in order to explain the principles of the invention and practical applications thereof, to enable others skilled in the art to best utilize the invention in various embodiments and with various modifications as are suited to the particular use contemplated. Accordingly, the present invention is not limited to the embodiments described above or depicted in the drawings, and various embodiments and modifications can be made without departing from the scope of the claims below.

Appendix A of U.S. Provisional Patent Application No. 62/771,979, which is incorporated by reference in its entirety for all purposes, includes further material that illustrates non-limiting embodiments.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure.

A recitation of "a", "an", or "the" is intended to mean "one or more" unless specifically indicated to the contrary. All patents, patent applications, publications, and descriptions mentioned here are incorporated by reference in their entirety for all purposes. None is admitted to be prior art.

What is claimed is:

1. A semiconductor laser device, comprising:
   a substrate having a first facet;
   a guiding layer having a second facet through which output light is configured to be emitted;
   a bottom dielectric layer between the substrate and the guiding layer; and
   a top dielectric layer on the guiding layer; and
   wherein the second facet is at an angle relative to the first facet, and wherein the angle is between 2° and 30°.

2. The semiconductor laser device of claim 1, wherein the angle is chosen such that the output light is substantially perpendicular to the first facet.

3. The semiconductor laser device of claim 1, further comprising a gain chip bonded to the substrate in a recess of the guiding layer, wherein:
   the gain chip comprising a third facet;
   the gain chip is optically end coupled with the guiding layer;
   the guiding layer comprises a waveguide; and
   the third facet is angled with respect to a propagation direction of the waveguide in the guiding layer.

4. The semiconductor laser device of claim 1, further comprising a coating on the second facet.

5. The semiconductor laser device of claim 4, wherein the coating is an antireflective coating.

6. The semiconductor laser device of claim 5, wherein a thickness of the antireflective coating is chosen based on the angle.

7. The semiconductor laser device of claim 4, wherein the coating is a single-layer coating.

8. The semiconductor laser device of claim 4, wherein the coating consists of a silicon-based materials, and the silicon-based materials include one or more of Si, $SiO_2$, $SiN_X$, $SiO_XN_Y$, SiC, or SiCO.

9. The semiconductor laser device of claim 1, wherein the guiding layer is crystalline silicon.

10. A semiconductor laser device, comprising:
    a substrate having a first facet;
    a guiding layer having a second facet through which output light is configured to be emitted, wherein the output light is arranged to pass over the first facet;
    a bottom dielectric layer between the substrate and the guiding layer; and
    a top dielectric layer on the guiding layer; and
    wherein the second facet is at an angle relative to the first facet.

11. The semiconductor laser device of claim 10, wherein the angle is between 2° and 30°.

12. A semiconductor laser device, comprising:
    a platform comprising:
      a substrate having a first facet;
      a guiding layer having a waveguide and a second facet through which an output light is configured to be emitted from the waveguide, wherein the second facet is at an angle relative to the first facet, wherein the angle is between 2° and 30°;
      a bottom dielectric layer between the substrate and the guiding layer;
      a top dielectric layer on the guiding layer; and
      walls forming a recess in the platform; and
    a gain chip bonded to the platform in the recess, the gain chip comprising a third facet, wherein:
      the gain chip is optically end coupled with the guiding layer of the platform; and
      the third facet is angled with respect to a propagation direction of the waveguide in the guiding layer.

13. The semiconductor laser device of claim 12, wherein:
    the substrate is from a handle portion of a silicon on insulator (SOI) wafer;
    the guiding layer is formed in a device layer of the SOI wafer; and
    the device layer of the SOI wafer is crystalline silicon.

14. The semiconductor laser device of claim 12, wherein the angle is chosen such that the output light is substantially perpendicular to the first facet.

15. The semiconductor laser device of claim 12, further comprising two mirrors formed in the guiding layer, wherein:
    the gain chip is optically between the two mirrors; and
    the two mirrors form a resonator cavity for the semiconductor laser device.

16. The semiconductor laser device of claim 12, wherein the platform further comprises a coating on the second facet.

17. The semiconductor laser device of claim 16, wherein the coating is an antireflective coating.

18. The semiconductor laser device of claim 17, wherein a thickness of the antireflective coating is chosen based on the angle.

19. The semiconductor laser device of claim 16, wherein the coating is a single-layer coating.

20. The semiconductor laser device of claim 16, wherein the coating consists of a silicon-based materials, and the silicon-based materials include one or more of Si, $SiO_2$, $SiN_X$, $SiO_XN_Y$, SiC, or SiCO.

* * * * *